US012453247B2

United States Patent
Mizusaki

(10) Patent No.: US 12,453,247 B2
(45) Date of Patent: Oct. 21, 2025

(54) DISPLAY DEVICE

(71) Applicant: SHARP KABUSHIKI KAISHA, Sakai (JP)

(72) Inventor: Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 617 days.

(21) Appl. No.: 17/441,974

(22) PCT Filed: Mar. 27, 2019

(86) PCT No.: PCT/JP2019/013464
§ 371 (c)(1),
(2) Date: Sep. 22, 2021

(87) PCT Pub. No.: WO2020/194633
PCT Pub. Date: Oct. 1, 2020

(65) Prior Publication Data
US 2022/0190068 A1 Jun. 16, 2022

(51) Int. Cl.
*H01L 27/32* (2006.01)
*H10K 50/12* (2023.01)
*H10K 59/122* (2023.01)

(52) U.S. Cl.
CPC .......... *H10K 59/122* (2023.02); *H10K 50/12* (2023.02)

(58) Field of Classification Search
CPC ..... H10H 59/122; H10H 59/126; H10H 50/12
USPC .......................................................... 257/40
See application file for complete search history.

(56) References Cited

U.S. PATENT DOCUMENTS

| | | | |
|---|---|---|---|
| 2004/0152392 A1* | 8/2004 | Nakamura | H10K 50/8426 445/25 |
| 2012/0099312 A1* | 4/2012 | Yoshioka | H10K 59/876 362/293 |
| 2012/0168787 A1* | 7/2012 | Okumoto | H10K 59/35 257/89 |
| 2012/0199856 A1* | 8/2012 | Koresawa | G02B 5/201 257/89 |

(Continued)

FOREIGN PATENT DOCUMENTS

| | | |
|---|---|---|
| JP | 2006-128325 A | 5/2006 |
| JP | 2010-237384 A | 10/2010 |

(Continued)

OTHER PUBLICATIONS

English Machine Translation of WO 2016/098758. (Year: 2016).*
English Machine Translation of JP 2010/237384. (Year: 2010).*
English Machine Translation of JP 2006/128325. (Year: 2006).*

*Primary Examiner* — Dzung Tran
(74) *Attorney, Agent, or Firm* — ScienBiziP, P.C.

(57) ABSTRACT

A display device includes a display area including a light-emitting element layer including a plurality of light-emitting elements, a TFT layer provided below the light-emitting element layer to drive the plurality of light-emitting elements, and a sealing layer covering the light-emitting element layer, and a frame area surrounding the display area. The light-emitting element layer is provided with a light-emitting layer for each color of red, green, and blue. The light-emitting layer of each color is partitioned by a bank constituted by a resin material, and each light-emitting layer includes a hydrazide compound or a nitroxy radical compound.

11 Claims, 15 Drawing Sheets

(56) References Cited

U.S. PATENT DOCUMENTS

| | | | |
|---|---|---|---|
| 2014/0191215 A1* | 7/2014 | Tojo | H10K 50/865 |
| | | | 257/40 |
| 2015/0090965 A1* | 4/2015 | Park | H10K 85/626 |
| | | | 548/425 |
| 2018/0114919 A1 | 4/2018 | Hashimoto et al. | |

FOREIGN PATENT DOCUMENTS

| | | |
|---|---|---|
| JP | 2018-101532 A | 6/2018 |
| WO | 2014/203840 A1 | 12/2014 |
| WO | 2016/098758 A1 | 6/2016 |
| WO | 2016/171153 A1 | 10/2016 |

* cited by examiner

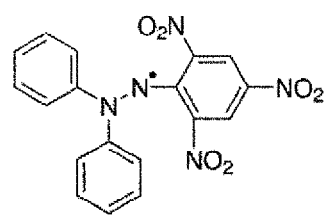
(COMPOUND 1)
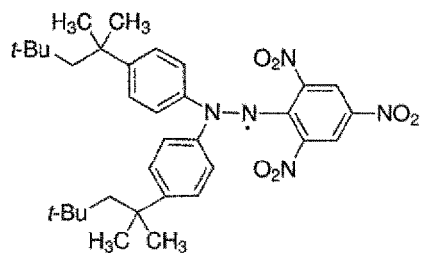
(COMPOUND 2)
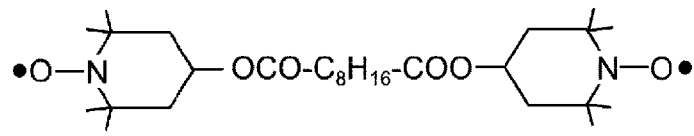
(COMPOUND 3)
FIG. 5

Table 1. Lifespan, EQE, Chromaticity

| Blue Dopant/Compound 1 wt/wt | Lifespan (time to reach 90% in relation to initial brightness) (h) | EQE (%) | Chromaticity (x, y) |
|---|---|---|---|
| 0 (Comparative Example 1) | 33 | 10.2 | (0.14, 0.05) |
| 1000/0.3 | 57 | 13.4 | (0.14, 0.05) |
| 1000/1 | 62 | 14.2 | (0.14, 0.05) |
| 100/1 | 65 | 14.4 | (0.14, 0.05) |
| 10/1 | 69 | 14.2 | (0.14, 0.05) |
| 10/3 | 68 | 14.3 | (0.14, 0.06) |
| 10/4 | 66 | 14.1 | (0.14, 0.08) |

FIG. 10

Table 2. Lifespan, EQE, Chromaticity

| Blue Dopant/Compound 2 wt/wt | Lifespan (time to reach 90% in relation to initial brightness) (h) | EQE (%) | Chromaticity (x, y) |
|---|---|---|---|
| 0 (Comparative Example 1) | 33 | 10.2 | (0.14, 0.04) |
| 1000/0.3 | 54 | 13.3 | (0.14, 0.04) |
| 1000/1 | 59 | 14.5 | (0.14, 0.05) |
| 100/1 | 64 | 14.4 | (0.14, 0.05) |
| 10/1 | 66 | 14.4 | (0.14, 0.05) |
| 10/3 | 68 | 14.4 | (0.14, 0.06) |
| 10/4 | 67 | 14.0 | (0.14, 0.07) |

FIG. 11

Table 3. Lifespan, EQE, Chromaticity

| Blue Dopant/Compound 3 wt/wt | Lifespan (time to reach 90% in relation to initial brightness) (h) | EQE (%) | Chromaticity (x, y) |
|---|---|---|---|
| 0 (Comparative Example 1) | 33 | 10.2 | (0.14, 0.04) |
| 1000/0.3 | 39 | 11.0 | (0.14, 0.04) |
| 1000/1 | 39 | 12.1 | (0.14, 0.05) |
| 100/1 | 52 | 13.5 | (0.14, 0.06) |
| 10/1 | 64 | 14.1 | (0.14, 0.06) |
| 10/3 | 65 | 13.8 | (0.14, 0.07) |
| 10/4 | 67 | 14.0 | (0.14, 0.08) |

FIG. 12

Table 5. Lifespan, EQE, Chromaticity

| Green Dopant/Compound 1 wt/wt | Lifespan (time to reach 90% in relation to initial brightness) (h) | EQE (%) | Chromaticity (x, y) |
|---|---|---|---|
| 0 (Comparative Example 1) | 38 | 27.4 | (0.21, 0.72) |
| 1000/0.3 | 62 | 35.0 | (0.22, 0.72) |
| 1000/1 | 69 | 37.1 | (0.22, 0.72) |
| 100/1 | 73 | 36.4 | (0.22, 0.72) |
| 10/1 | 76 | 38.7 | (0.23, 0.71) |
| 10/3 | 76 | 35.6 | (0.26, 0.64) |
| 10/4 | 71 | 30.2 | (0.29, 0.66) |

FIG. 14

Table 6. Lifespan, EQE, Chromaticity

| Red Dopant/Compound 1 wt/wt | Lifespan (time to reach 90% in relation to initial brightness) (h) | EQE (%) | Chromaticity (x, y) |
|---|---|---|---|
| 0 (Comparative Example 1) | 270 | 38.4 | (0.68, 0.32) |
| 1000/0.3 | 290 | 40.5 | (0.68, 0.32) |
| 1000/1 | 295 | 40.5 | (0.68, 0.32) |
| 100/1 | 295 | 41.1 | (0.67, 0.32) |
| 10/1 | 292 | 40.3 | (0.69, 0.31) |
| 10/3 | 296 | 40.6 | (0.67, 0.31) |
| 10/4 | 295 | 39.3 | (0.69, 0.32) |

FIG. 15

DISPLAY DEVICE

TECHNICAL FIELD

The disclosure relates to a display device.

BACKGROUND ART

The current mainstream method for forming an organic light-emitting diode (OLED) is a vapor deposition method. In order to divide the OLED into three colors of red (R), green (G), and blue (B), an anode electrode (anode, ITO is usually used) is formed and patterned, after which R, G, and B are respectively vapor deposited, and each color is applied separately. Here, banks are formed between the R, G, and B in order to suppress color mixing of each color.

For example, the following PTL 1 indicates that a bank is formed from a polyimide resin.

CITATION LIST

Patent Literature

PTL 1: JP 2018-101532 A (publication date: Jun. 28, 2018)

SUMMARY

Technical Problem

When a polyimide resin is used to form a bank, the formation and patterning of the polyimide resin layer are typically implemented in the following manner. Namely, first, a polyamic acid solution (NMP is ordinarily used as the solvent) containing a photosensitive component (polymerizable group component) is applied to a base material, and then fired and imidized. Next, ultraviolet light (i-rays) exposure through a mask is implemented, the methacryl groups of polyimide side chains undergo radical polymerization, and the polymerized locations become insoluble in a solvent. This layer is subsequently treated with a solvent, and only the locations not covered with the mask remain as banks.

Here, a photo-radical polymerization initiator is used to photopolymerize the methacryl groups. When some of the photo-radical polymerization initiator remains in a display section corresponding to an unexposed area, the remaining polymerization initiator promotes quenching of light emitted from the element, and may cause unevenness and shorten the lifespan.

In light of these problems, an object of the disclosure is to provide a display device in which display unevenness and a shortening of the lifespan are suppressed.

Solution to Problem

In order to solve the problems described above, a display device according to one aspect of the present application includes:
- a display area including a light-emitting element layer including a plurality of light-emitting elements, a TFT layer provided on a lower layer of the light-emitting element layer to drive the light-emitting elements, and a sealing layer covering the light-emitting element layer; and
- a frame area surrounding the display area, wherein the light-emitting element layer is provided with a light-emitting layer of each color of red, green, and blue, the light-emitting layers of each color are partitioned by a bank constituted by a resin material, and each light-emitting layer includes a hydrazide compound, a nitroxy radical compound, or a quinone or anthraquinone-based compound.

Advantageous Effects of Disclosure

A display device in which display unevenness and a shortening of the lifespan are suppressed can be provided.

BRIEF DESCRIPTION OF DRAWINGS

FIG. 5 is a diagram illustrating examples of hydrazyl-based radical scavengers.

FIG. 10 is a diagram showing Table 1 in which results of Example 1 are presented.

FIG. 11 is a diagram showing Table 2 in which results of Example 2 are presented.

FIG. 12 is a diagram showing Table 3 in which results of Example 3 are presented.

FIG. 13 is a diagram showing Table 4 in which results of Example 4 are presented.

FIG. 14 is a diagram showing Table 5 in which results of Example 5 are presented.

FIG. 15 is a diagram showing Table 6 in which results of Example 6 are presented.

DESCRIPTION OF EMBODIMENTS

Configuration of Display Device

Figure 1:
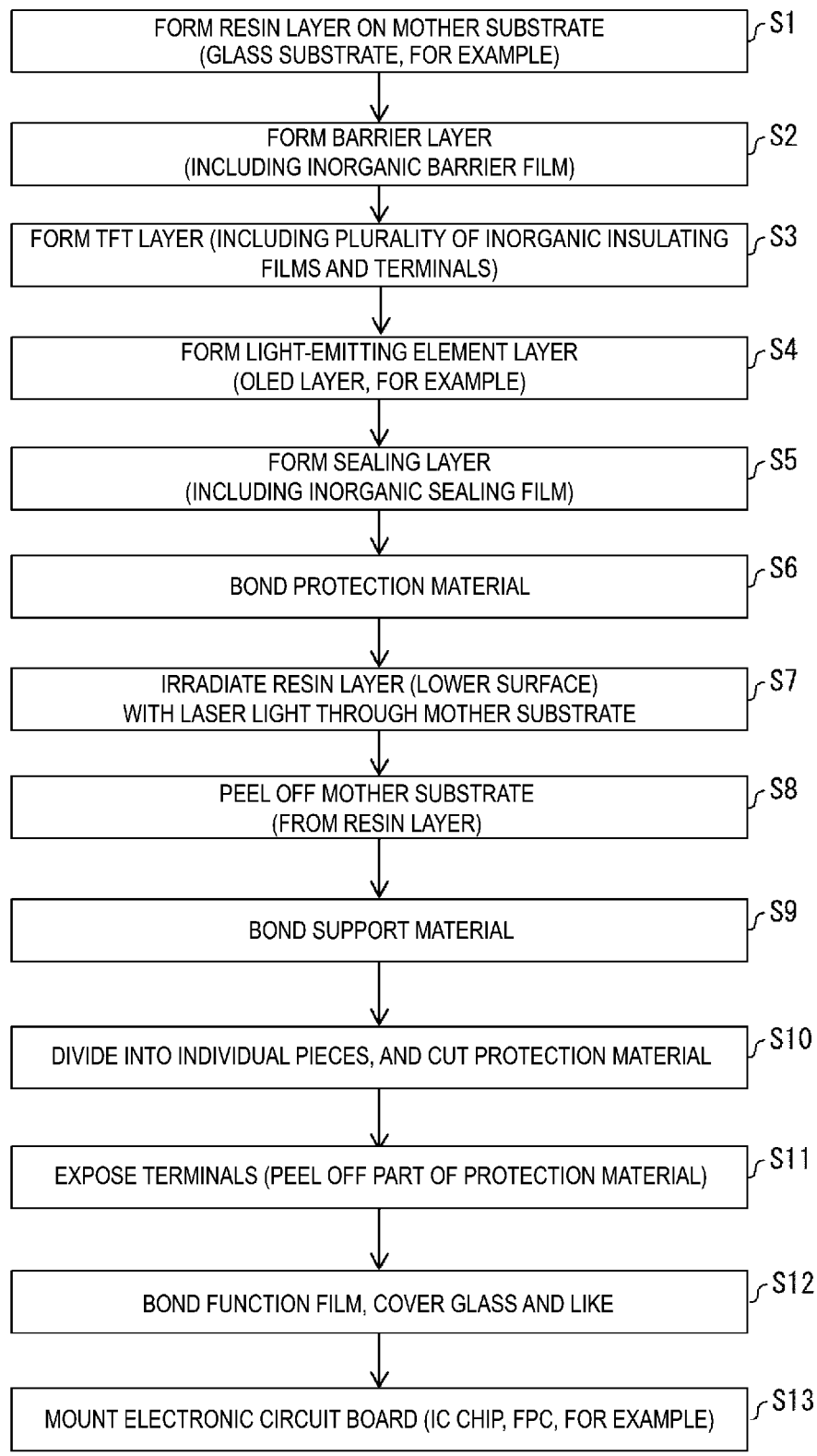
FIG. 1 is a flowchart illustrating an example of a method of manufacturing a display device 1 provided with an OLED.
Figure 2:
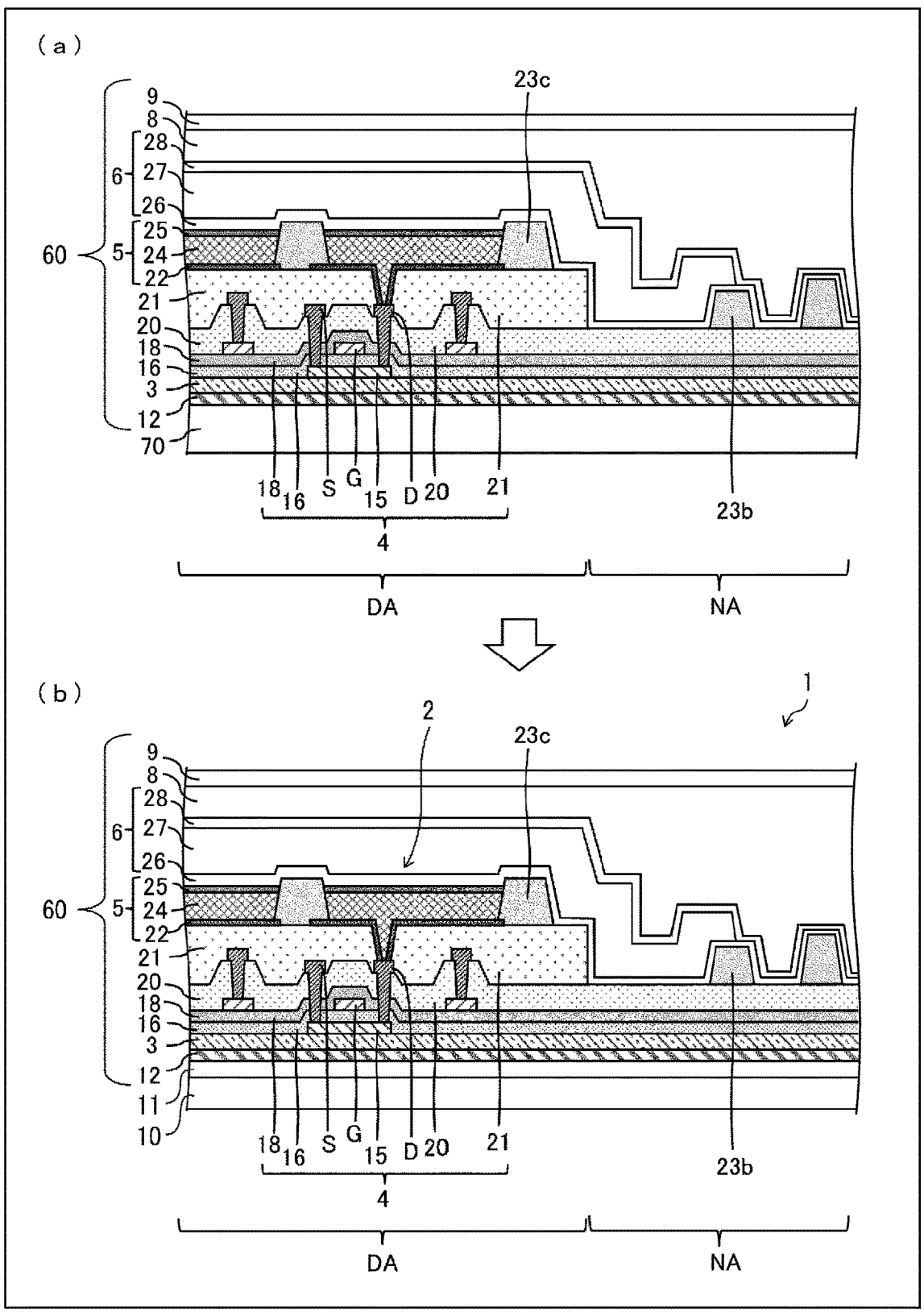
FIG. 2(a) is a cross-sectional view illustrating a configuration example of the display device 1 of the present embodiment during formation.
FIG. 2(b) is a cross-sectional view illustrating a configuration example of the display device 1 of the present embodiment.

A display device 1 of the disclosure is described on the basis of FIGS. 1 and 2. As an example of the display device 1, the configuration, etc. of a display device 1 provided with an organic light-emitting diode (OLED) as a light-emitting element 2 is described below.

FIG. 1 is a flowchart illustrating an example of a method of manufacturing the display device 1 provided with an OLED. FIG. 2(a) is a cross-sectional view illustrating a configuration example of the display device 1 according to the present embodiment during formation. FIG. 2(b) is a cross-sectional view illustrating a configuration example of the display device 1 according to the present embodiment.

When a flexible display device 1 is to be manufactured, as illustrated in FIGS. 1 and 2, the manufacturing process generally passes through the following steps S1 to S13.

Step S1: Form a resin layer 12 on a transparent mother substrate 70 such as a glass substrate.

Step S2: Form an inorganic barrier film 3.

Step S3: Form a thin film transistor layer (TFT layer) 4 including a plurality of inorganic insulating films 16, 18, and 20 and a flattening film 21.

Step S4: Form a light-emitting element layer 5 such as an OLED element layer.

Step S5: Form a sealing layer 6 including inorganic sealing films 26 and 28 and an organic sealing film 27.

Step S6: Bond a protection material 9 such as a PET film onto the sealing layer 6 through an adhesive layer 8.

Step S7: Irradiate the resin layer 12 with laser light. Here, the resin layer 12 absorbs the irradiated laser light, and thereby the lower surface of the resin layer 12, which is an interface with the mother substrate 70, is modified through ablation. Through this, a peeling layer is formed, and the bonding force between the resin layer 12 and the mother substrate 70 is reduced.

Step S8: Peel the mother substrate 70 from the resin layer 12. This causes a layered body 60 to be peeled from the mother substrate 70. Herein, the layered body 60 indicates the entire multilayer body formed on the mother substrate 70, and in the example illustrated in FIG. 2(a), indicates the layers from the resin layer 12 formed on the mother substrate 70 to a protection material 9, which is the outermost layer.

Step S9: Bond a support material 10 such as a PET film to the lower surface of the resin layer 12 through an adhesive layer 11.

Step S10: Divide the mother substrate 70, cut the protection material 9, and cut out a plurality of light-emitting elements 2.

Step S11: Peel away the protection material 9 on a terminal portion of the TFT layer 4, which drives the light-emitting elements 2, and thereby expose a terminal.

Step S12: Bond a function film (not illustrated).

Step S13: Mount an electronic circuit board to the terminal portion using an anisotropic conductive film (ACF) or the like.

Through the above steps, the display device 1 provided with an OLED is formed as one example of a flexible display.

As illustrated in FIGS. 2(a) and 2(b), the thin film transistor layer 4 includes a gate electrode G, a source electrode S, and a drain electrode D, and a semiconductor film 15 is formed below the gate electrode G with a gate insulating film 16 interposed therebetween. The drain electrode D is connected to an anode electrode 22, and an EL layer 24 used as a light-emitting layer is sandwiched between the anode electrode 22 and a cathode electrode 25. Adjacent EL layers 24 are partitioned by a bank 23c.

Furthermore, as the sealing layer 6, a first inorganic sealing film 26, an organic sealing film 27, and a second inorganic sealing film 28 are formed in this order above the light-emitting element layer 5, and the sealing layer 6 extends to a partitioning wall 23b.

The display device 1 can also be divided into an active area DA and a non-active area NA surrounding the active area DA.

Here, the active area DA corresponds to an area in which the light-emitting element layer 5 is formed (an area in which the semiconductor film 15, the gate electrode G, the source electrode S, and the drain electrode D are formed), and can be represented as a display area. On the other hand, the non-active area NA is an area besides the active area DA, is a frame area surrounding the display area, and is an area in which terminals used for connection with the electronic circuit board and the like are formed. In addition to the constituent elements described above, the display device 1 is configured by adding necessary constituent elements such as a housing and a control and power supply system. The EL layer 24 includes a hole injection layer, a hole transport layer, an electron transport layer, an electron injection layer, an electron blocking layer, a hole blocking layer, and a plurality of light-emitting layers (the layers thereof are not illustrated). Note that the layers other than the light-emitting layer are not essential to the EL layer 24, and may be formed, as appropriate, in accordance with the properties that are required of a light-emitting element 24.

Formation of Bank

Figure 3:
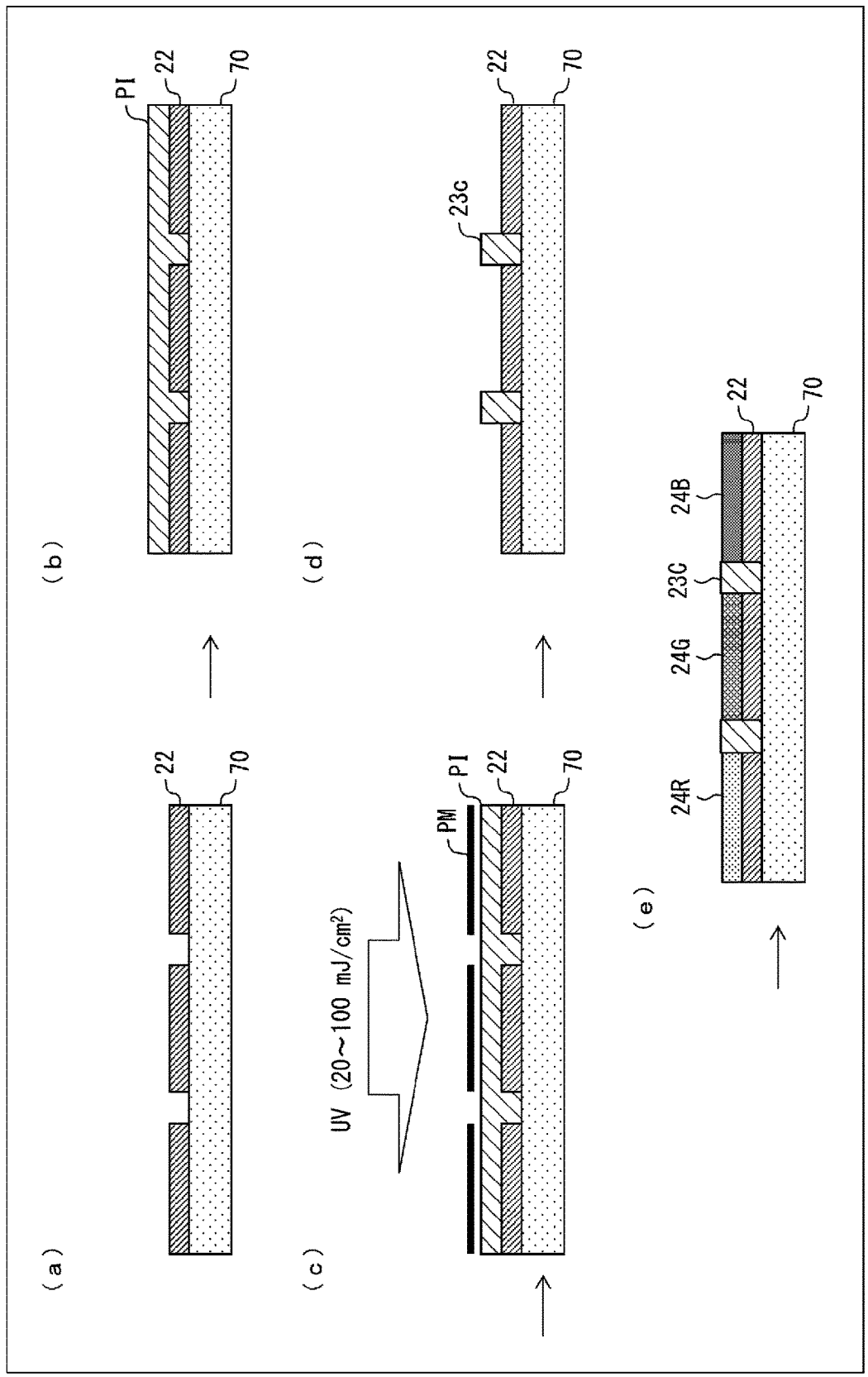
FIG. 3 is a diagram illustrating an overview of a process for forming a bank 23c.

The disclosure pertains particularly to the bank 23c in the display device 1 described above. The formation of the bank 23c is described below on the basis of FIG. 3. FIG. 3 is a diagram illustrating an overview of the formation of the bank 23c.

As illustrated in FIG. 3, the bank 23c is provided on the mother substrate 70 to separate each of the RGB EL layers 24 (red EL layer 24R, green EL layer 24G, blue EL layer 24B) and the anode electrodes 22 corresponding thereto. The bank 23c acts to suppress color mixing in the display. An overview of the process of forming the bank 23c using photolithography is described below.

First, an anode electrode 22 is formed on the mother substrate 70 at each position corresponding to the EL layers 24 of each color (FIG. 3(a)). Next, a polyimide resin layer PI is formed as a resist material on the mother substrate 70 to cover the anode electrodes 22 (FIG. 3(b)). Next, the polyimide resin layer PI is irradiated with UV light through a photomask PM in which locations corresponding to the banks 23c are opened (FIG. 3(c)). Next, a bank 23c is formed through a developing process at each location corresponding to the openings in the photomask PM (FIG. 3(d)). Next, an EL layer of each color is formed at a desired position through separate application by RGB vapor deposition.

More specific details are as follows. A polyimide resin having high heat resistance is often used to form the bank 23c. The polyimide resin layer is typically formed and patterned by first applying, to a substrate, a polyamic acid solution, for example an N-methylpyrrolidone (NMP) solution, the polyamic acid solution being a precursor of a polyimide resin and containing a photosensitive component that is a polymerizable group component, and then subjecting to firing and imidization to obtain the polyimide resin layer. This application of the polyamic acid solution to the substrate is implemented by, for example, spin coating or printing.

Next, the polyimide resin layer is exposed to ultraviolet light (for example, i-rays, 20 to 100 mJ/cm$^2$) through a photomask, and the methacryl groups of the polyimide side chains are radically polymerized. As a result, the polymerized locations become insoluble in a solvent.

Next, the substrate is treated with a solvent, and thereby only the developed locations, that is, only the locations not covered by the photomask, remain on the substrate as banks 23c.

Here, a photo-radical polymerization initiator (may be simply referred to as a "polymerization initiator") is added to the polyimide resin layer to photopolymerize the polymerizable functional groups such as methacryl groups.

This photo-radical polymerization initiator remains slightly in the banks 23c. Furthermore, in some cases, the photo-radical polymerization initiator present in the banks 23c may be mixed into the EL layers 24 formed adjacent to the banks 23c.

The inventors discovered that when the photo-radical polymerization initiator is mixed into the EL layers 24, the photo-radical polymerization initiator promotes quenching of light emission and causes a reduction in display characteristics such as the occurrence of display unevenness and a shortening of the lifespan.

EMBODIMENTS

Figure 4:
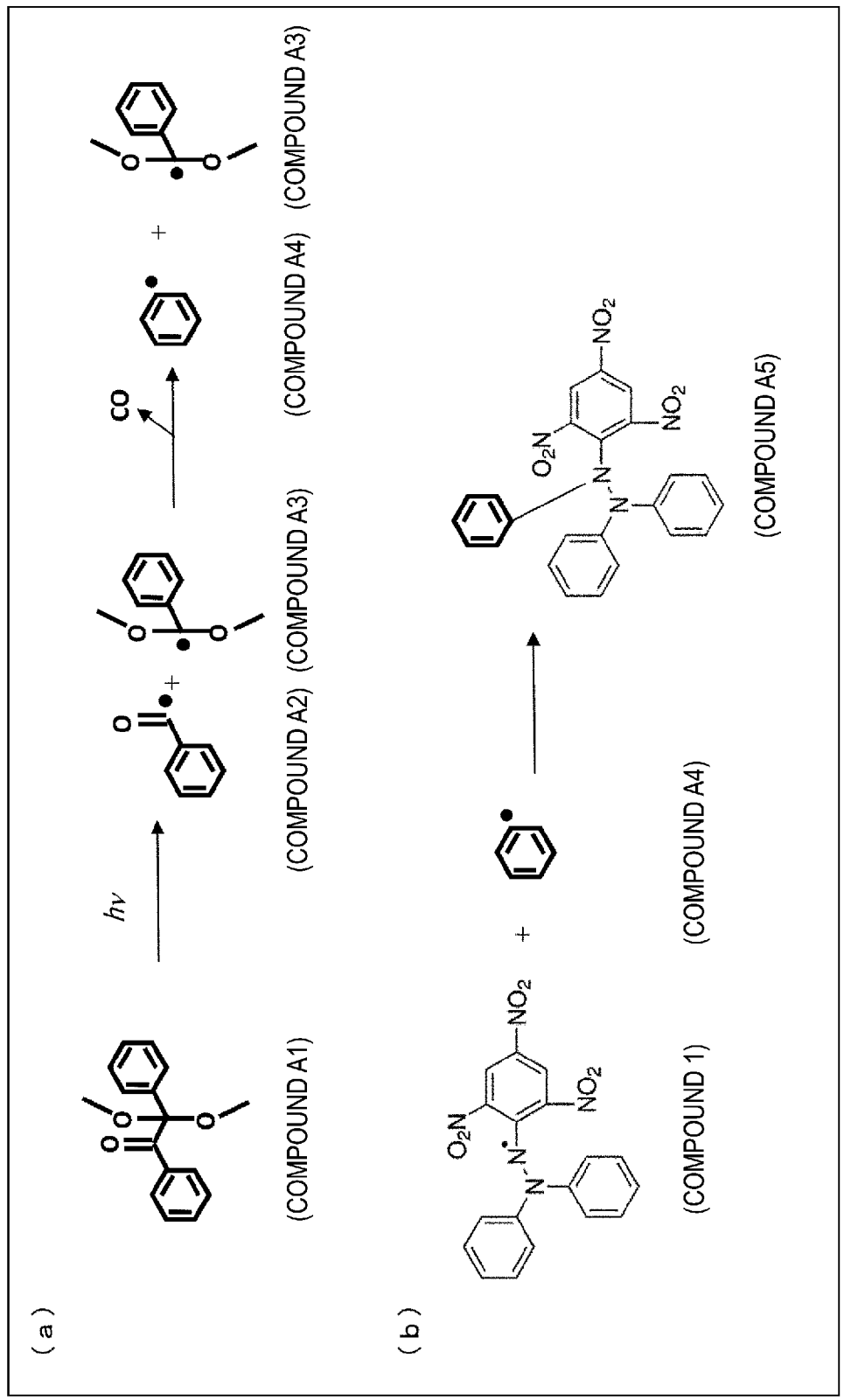
FIG. 4 is a diagram illustrating details such as the generation of radicals in a photo-radical polymerization initiator and the scavenging thereof.

A first embodiment of the disclosure is described with reference to FIG. 4. FIG. 4 is a diagram illustrating details such as the generation of radicals in the photo-radical polymerization initiator and the scavenging thereof. FIG. 4 (a) illustrates a process in which a photo-radical polymerization initiator generates radicals through light irradiation, and FIG. 4 (b) illustrates the scavenging of the remaining radicals by a radical scavenger.

As illustrated in FIG. 4(a), a compound A1, which is an example of a photo-radical polymerization initiator, is irradiated with light (hv) and split into compounds A2 and A3 having respective radicals. Furthermore, in the photopolymerization process, CO separates, and a compound A4 and the compound A3 remain in the system as remaining radicals, and remain in the banks 23c.

After the EL layers 24 are formed adjacent to the banks 23c, the remaining radicals remaining in the banks 23c may transfer to the EL layers 24.

Here, in the first embodiment, a radical scavenger is introduced into the EL layers 24, which are light-emitting layers. Therefore, even if the remaining radicals are transferred from the banks 23c to the EL layers 24, the remaining radicals are scavenged by the radical scavenger before causing a decrease in the display characteristics. As a result, a decrease in display characteristics can be suppressed.

Specifically, as illustrated in FIG. 4(b), a compound 1, which is a radical scavenger, scavenges the compound A4, which is a remaining radical, and a state is created in which a radical indicated by the compound A5 is scavenged. Through this, the radical of the compound A4 is eliminated. Furthermore, the compound A3, which is another remaining radical illustrated in FIG. 4(a), is scavenged by the compound 1 through the same reaction as the compound A4, and the radical thereof is eliminated.

Here, the radical scavenger is preferably a hydrazide compound or a nitroxy radical compound. This is because hydrazide compounds or nitroxy radical compounds effectively scavenge radicals.

Furthermore, as depicted in FIG. 3(e), the radical scavenger is preferably introduced into a central portion (center portion) 100 of the light-emitting layer. Through this, the suppression (quenching) of light emission from excitons (or light emission by luminescent bodies that have received energy transfer from excitons) by the remaining radicals can be effectively suppressed without hindering the transfer of carriers (electrons or holes).

As described above, in the disclosure, radical scavengers such as hydrazide compounds can effectively react with the photo-radical polymerization initiator and eliminate radicals. Therefore, a suppression of light emission from the OLED light-emitting layer can be suppressed.

Note that the method for introducing the radical scavenger into the light-emitting layer can be, for example, a method in which the radical scavenger and a material forming the light-emitting layer are mixed in advance and then vapor deposited onto the substrate. Alternatively, a method may be used in which the radical scavenger and the material forming the light-emitting layer are placed in separate crucibles, for example, and are simultaneously vapor deposited onto the substrate.

Radical Scavenger

Note that the radical scavenger is preferably a hydrazide compound or a nitroxy radical compound. Specific examples of these compounds include the compounds illustrated in FIG. 5, namely hydrazide compounds including the compound 1: 2,2-diphenyl-1-picrylhydrazyl and the compound 2: 2,2-di(4-tert-octylphenyl)-1-picrylhydrazyl, as well as a nitroxy radical (—N—O)-based compound illustrated by the compound 3. Note that the compound 1 illustrated in FIG. 5 is the same as the compound 1 illustrated in FIG. 4.

Figure 6:
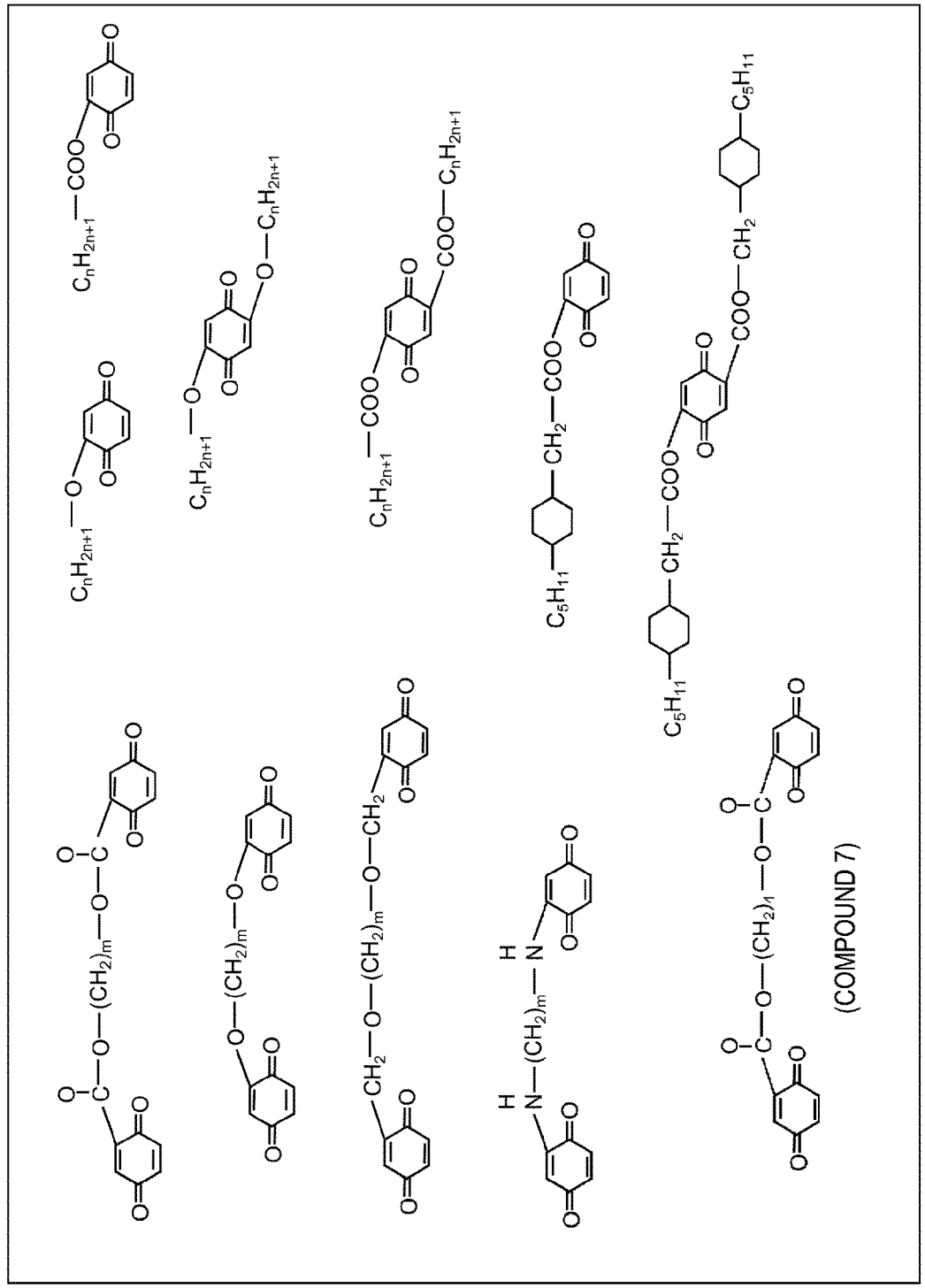
FIG. 6 is a diagram illustrating examples of quinone-based radical scavengers.
Figure 7:
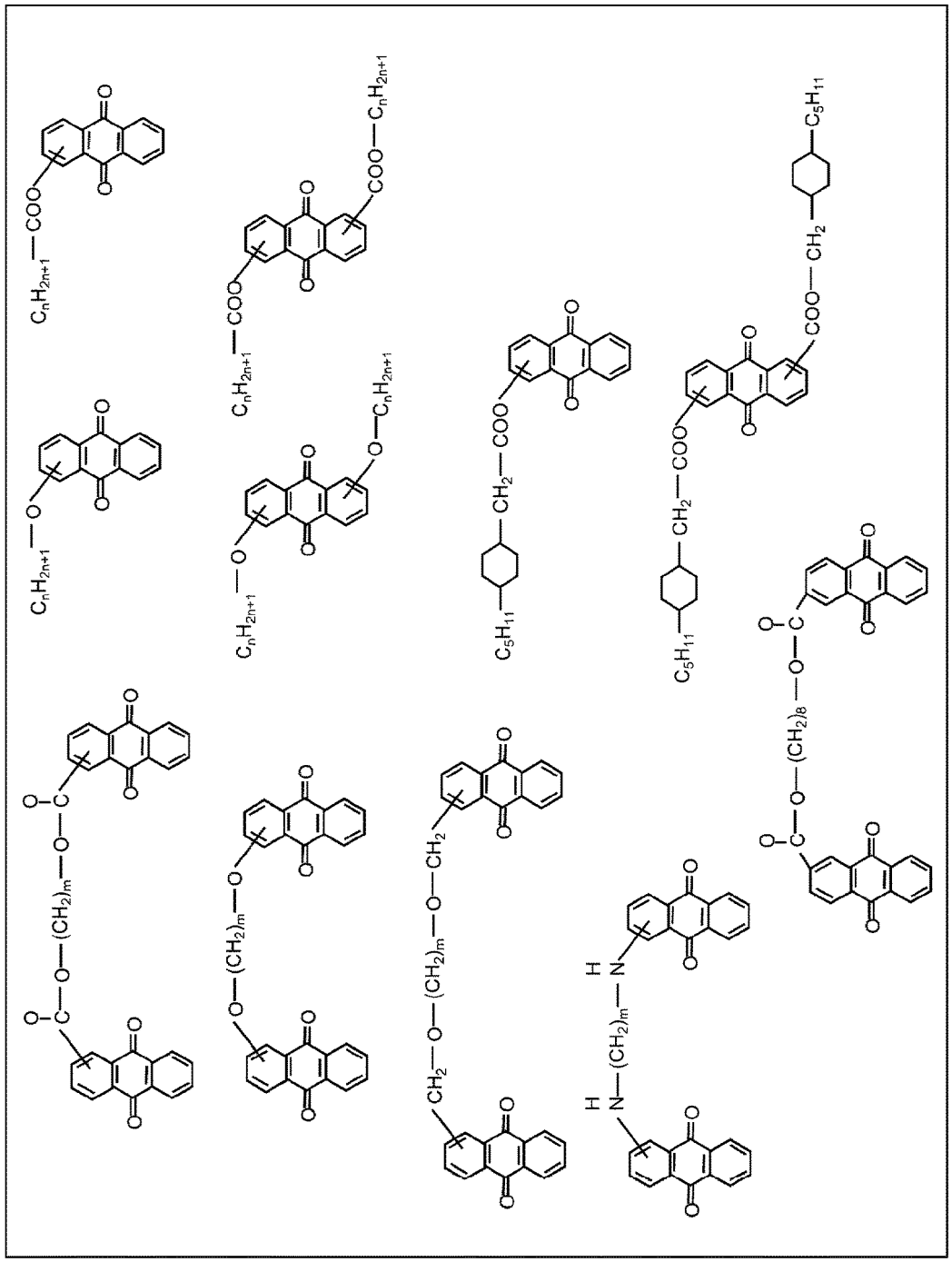
FIG. 7 is a diagram illustrating examples of anthraquinone-based radical scavengers.

Furthermore, examples of other radical scavengers include quinone-based compounds (for example, the compound 7) illustrated in FIG. 6, and anthraquinone-based compounds illustrated in FIG. 7. Note that in FIGS. 6 and 7, n is an integer from 1 to 18, and m is an even number from 2 to 18.

Dopant Material

Figure 8:
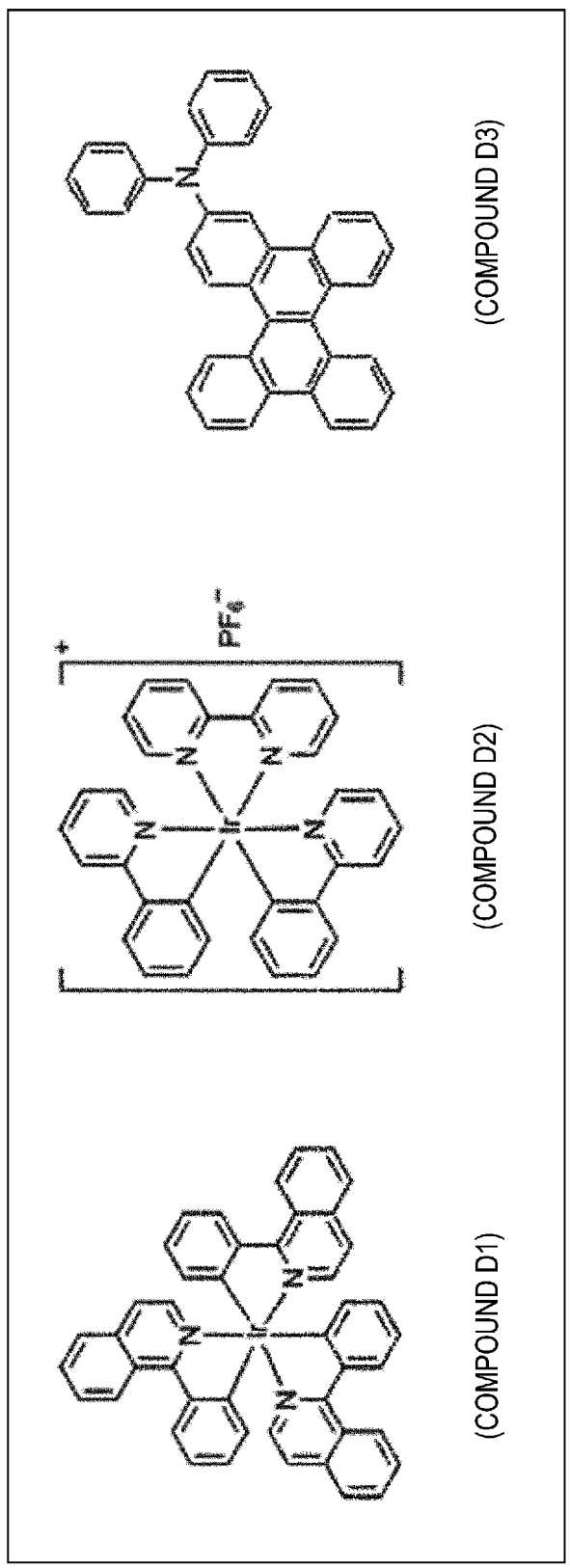
FIG. 8 is a diagram illustrating examples of dopant materials.

Examples of the dopant material used in the light-emitting layer of the present embodiment include the compounds illustrated in FIG. 8. In FIG. 8, the compound D1 is a red luminescent material (red dopant) of tris[1-phenylisoquinoline-$C^2$,N] iridium, the compound D2 is a green luminescent material (green dopant) of (2,2'-bipyridine)bis(2-phenylpyridinato)iridium (III) hexafluorophosphate, and the compound D3 is a blue luminescent material (blue dopant) of 3-(diphenylamino)dibenzo[g,p] chrysene.

Host Material

Figure 9:
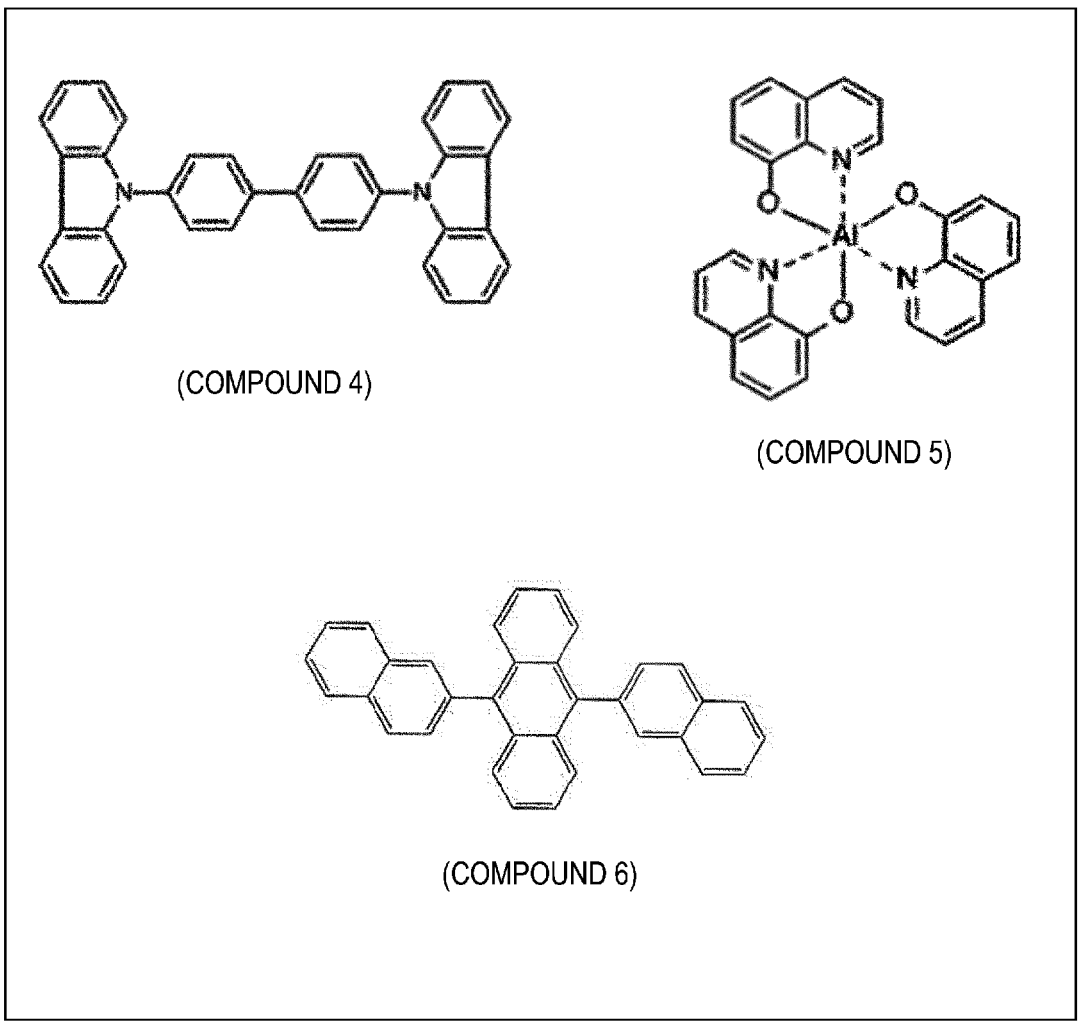
FIG. 9 is a diagram illustrating examples of host materials.
Figure 3:
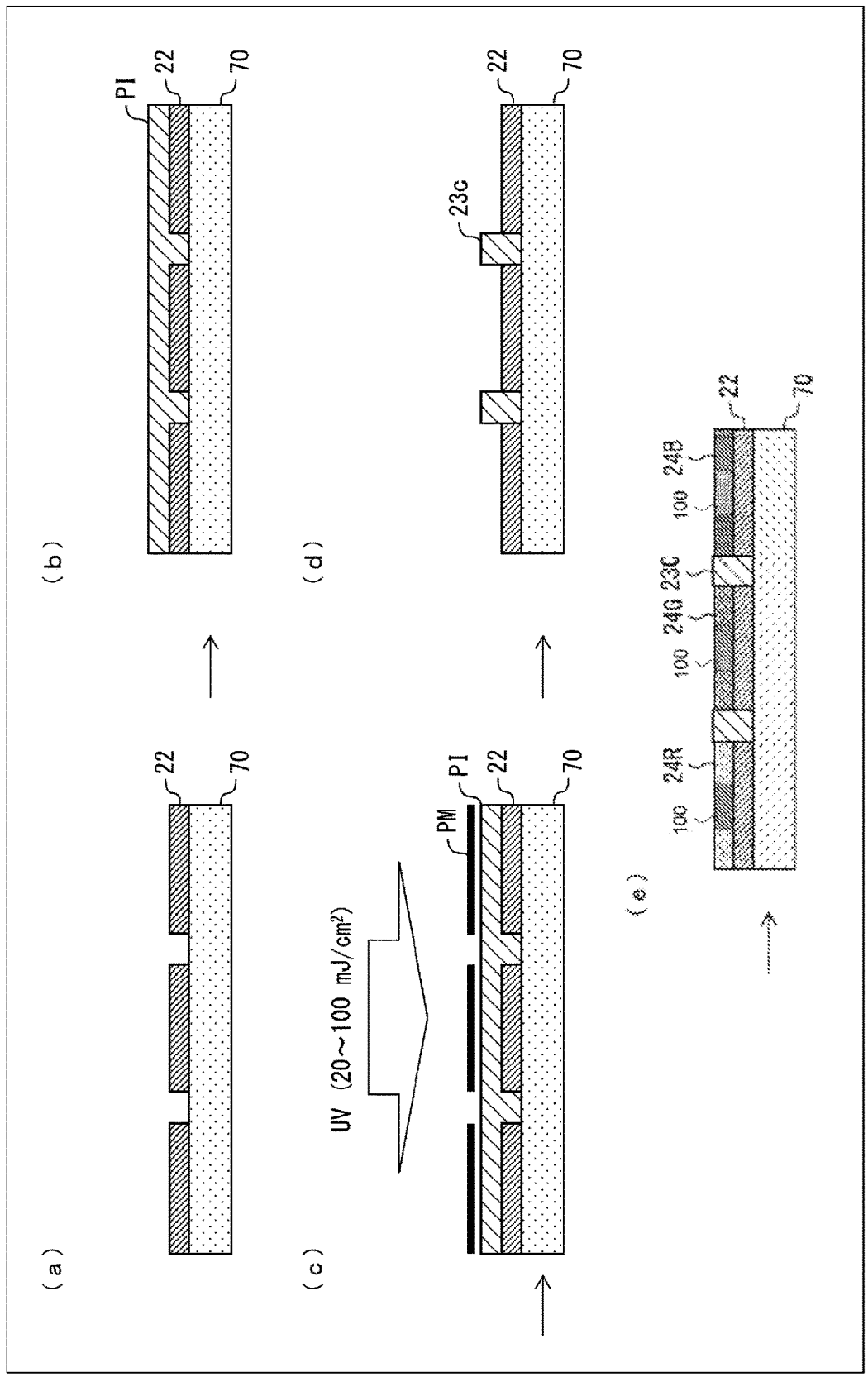

Examples of the host material used in the light-emitting layer of the present embodiment include the compounds illustrated in FIG. 9. In FIG. 9, the compound 4 is a red host material and a green P-type host material of 4,4'-bis(9H-carbazol-9-yl) biphenyl, the compound 5 is a green N-type host material of tris(8-quinolinato)aluminum, and the compound 6 is a blue host material of 9,10-bis(naphthyl)anthracene. Note that at least one of the compound 4 and the compound 5 can be used as a green host material.

Various examples according to the above-described embodiments are described below.

Example 1

A display device having a blue EL layer as a light-emitting layer was produced according to the method described on the basis of FIG. 3.

Specifically, a polyimide-based resist solution (solvent: NMP) was formed into a film on a mother substrate having an ITO electrode as an anode electrode, and was subjected to UV exposure at 100 mJ/cm$^2$ (i-rays) through a photomask.

Subsequently, the obtained product was immersed in a developing solution, and unreacted areas of the polyimide resin layer were removed. In the UV-irradiated areas, which are the areas of the polyimide resin layer corresponding to the openings of the photomask, the polyimide resin layer was formed as banks.

Next, a material that forms the light-emitting layer was vapor deposited onto the areas where banks were not formed, a light-emitting element layer including the light-emitting layer was created, and the light-emitting element layer was subjected to a sealing treatment.

In Example 1, as a dopant in the light-emitting layer, a compound D3, which is a blue coloring material illustrated in FIG. 8, was used as a blue dopant.

In addition, when the light-emitting layer was formed by vapor deposition, a mixed material in which the blue dopant and a hydrazyl-based radical scavenger were blended was used as a vapor deposition source. Here, in Example 1, a compound 1: 2,2-diphenyl-1-picrylhydrazyl was used as the hydrazyl-based radical scavenger.

As described above, a blue light-emitting layer containing a radical scavenger was formed.

In addition, when the vapor deposition was implemented, the weight ratio of the compound D3 and the compound 1 was set to 1000/0.3, 1000/1, 100/1, 10/1 10/3, and 10/4. Moreover, as a comparative example, only the compound D3, which is a blue coloring material, was vapor deposited, and a display device not containing the compound 1, which is a radical scavenger, in the light-emitting layer, was prepared.

The lifespan (lifetime) of the blue display device was measured at a current driving condition of 10 mA/cm$^2$ (in a 25° C. environment). In addition, the external quantum efficiency (EQE) and chromaticity (x, y) were also evaluated.

The results are shown in Table 1 of FIG. 10.

As shown in Table 1, by introducing the compound 1, which is a hydrazyl-based radical scavenger, into the dopant material (or near the material thereof) in the light-emitting layer at a weight ratio of the dopant to the compound 1 of 1000/0.3, the EQE was significantly increased, and the lifespan was significantly lengthened. The effect of introducing the radical scavenger was also confirmed. Namely, it was confirmed that when the ratio of the introduced amount of the hydrazyl-based radical scavenger was further increased, the EQE further increased, and the lifespan was further lengthened.

On the other hand, when the weight ratio was 10/4, the chromaticity of blue became remarkably pale. It is thought that this occurred because the light-emission wavelength shifted to the long wavelength side.

According to the above, it is thought that a range of from 0.0003 to 0.3 in terms of the weight ratio with respect to the dopant is an appropriate range for introduction of the hydrazyl-based radical scavenger into the light-emitting layer.

Next, other examples are described in order. Note that the following description focuses primarily on differences from the above-described example.

Example 2

Example 2 differs from Example 1 in that a compound 2: 2,2-di(4-tert-octylphenyl)-1-picrylhydrazyl was used as the hydrazyl-based radical scavenger.

The results are shown in Table 2 of FIG. 11.

As shown in Table 2, even when the compound 2 was used as the hydrazyl-based radical scavenger, similar to the case of Example 1 in which the compound 1 was used, the effect of introduction into the light-emitting layer was obtained in the range of from 0.0003 to 0.3 in terms of the weight ratio with respect to the dopant.

Example 3

Example 3 differs from Example 1 in that the compound 3, which is a nitroxy radical (—N—O)-based compound illustrated in FIG. 5, was used as the hydrazyl-based radical scavenger.

The results are shown in Table 3 of FIG. 12.

As shown in Table 3, unlike Examples 1 and 2 in which hydrazyl-based radical scavengers were used, improvements in the lifespan and EQE were minimal with the compound 3, even when the compound 3 was introduced at a weight ratio of the dopant to the compound 3 of from 1000/0.3 to 1000/1. Furthermore, an improvement effect was confirmed at weight ratios of 100/1 or higher, and a sufficient effect was obtained at a weight ratio of 10/1 or higher.

Thus, with respect to the compound 3, it is thought that the cause for the relatively small effect of improving the characteristics through radical scavenging is that the stability of the nitroxy radical is smaller than that of the hydrazyl radical, and the time period in which the nitroxy radical is present in a radical state is shorter, and therefore the presence ratio of nitroxy radicals in the light-emitting layer becomes relatively small compared to the hydrazyl radicals.

On the other hand, the blue chromaticity became remarkably pale with introduction at a weight ratio of 10/4. It is thought that this occurred because the light-emission wavelength shifted to the long wavelength side.

According to the above, it is thought that a range of from 0.001 to 0.3 in terms of the weight ratio with respect to the dopant is an appropriate range for introduction of the nitroxy radical-based scavenger into the light-emitting layer.

Example 4

Example 4 differs from Example 1 in that the compound 7, which is a quinone-based compound and is illustrated in FIG. 6, was used as the hydrazyl-based radical scavenger.

The results are shown in Table 4 of FIG. 13.

As shown in Table 4, the EQE was increased and the lifespan was lengthened by introducing the quinone-based compound 7 into the dopant material (or near the material thereof) in the light-emitting layer at a weight ratio of 100/1 of the dopant to the compound 7.

From the above, the effect of introducing the quinone-based radical scavenger was confirmed.

Example 5

Example 5 differs from Example 1 in that a compound D2 (green dopant), which is a green coloring material illustrated in FIG. 8, was used as the dopant in the light-emitting layer.

The results are shown in Table 5 of FIG. 14.

As shown in Table 5, in the green light-emitting layer as well, similar to Example 1 with the blue light-emitting layer, the compound 1, which is a hydrazyl-based radical scavenger, was introduced into the dopant at a weight ratio of 1000/0.3, and thereby the EQE increased significantly, and the lifespan was also significantly lengthened. Furthermore, when the ratio of the introduction of the hydrazyl-based radical scavenger was further increased, the EQE further increased, and the lifespan was further lengthened, and thus the effect of introducing a radical scavenger was confirmed.

On the other hand, when the weight ratio was set to 10/3, a slight yellowish color began to appear, and when the weight ratio was set to 10/4, the EQE declined, and the yellowish color became remarkable.

According to the above, it is thought that similar to the blue light-emitting layer of Example 1, a range of from 0.0003 to 0.3 in terms of the weight ratio with respect to the dopant is an appropriate range for introduction of the hydrazyl-based radical scavenger into the green light-emitting layer.

Example 6

Example 6 differs from Example 1 in that a compound D1 (red dopant), which is a red coloring material illustrated in FIG. 8, was used as the dopant in the light-emitting layer.

The results are shown in Table 6 of FIG. 15.

As shown in Table 6, in the red light-emitting layer as well, similar to Example 1 with the blue light-emitting layer, the compound 1, which is a hydrazyl-based radical scavenger, was introduced into the dopant at a weight ratio of 1000/0.3, and thereby the EQE increased significantly, and the lifespan was also significantly lengthened. Furthermore, when the ratio of the introduction of the hydrazyl-based radical scavenger was further increased, the EQE further increased, and the lifespan was further lengthened, and thus the effect of introducing a radical scavenger was confirmed.

On the other hand, when the weight ratio was set to 10/4, a tendency of the EQE to decrease slightly was exhibited.

According to the above, it is thought that similar to the blue light-emitting layer of Example 1, a range of from 0.0003 to 0.3 in terms of the weight ratio with respect to the dopant is an appropriate range for introduction of the hydrazyl-based radical scavenger into the red light-emitting layer.

Other Configurations

Note that in the examples described above, a radical scavenger was introduced into the light-emitting layer. However, the target for introduction of the radical scavenger is not limited to only the light-emitting layer. For example, a radical scavenger may be introduced into a layer or the like that is continuous with the light-emitting layer, such as a hole transport layer or other such common layer. Furthermore, a layer into which the radical scavenger is introduced is more preferably a layer having a thick film thickness.

Supplement

As described above, a display device according to a first aspect of the disclosure includes:

a display area including a light-emitting element layer including a plurality of light-emitting elements, a TFT layer provided on a lower layer of the light-emitting element layer to drive the light-emitting elements, and a sealing layer covering the light-emitting element layer; and a frame area surrounding the display area, wherein the light-emitting element layer is provided with a light-emitting layer of each color of red, green, and blue, the light-emitting layers of each color are partitioned by a bank constituted by a resin material, and each light-emitting layer includes a hydrazide compound, a nitroxy radical compound, or a quinone or anthraquinone-based compound.

In a display device according to a second aspect of the disclosure, the bank includes a photo-radical polymerization initiator.

In a display device according to a third aspect of the disclosure, the hydrazide compound is the compound 1 illustrated in FIG. 5.

In a display device according to a fourth aspect of the disclosure, the hydrazide compound is the compound 2 illustrated in FIG. 5.

Also, in a display device according to a fifth aspect of the disclosure, the nitroxy radical compound is the compound 3 illustrated in FIG. 5.

In a display device according to a sixth aspect of the disclosure, the light-emitting layer includes a dopant material, and a weight ratio of the hydrazide compound to the dopant material is from 0.0003 to 0.3.

In a display device according to a seventh aspect of the disclosure, the light-emitting layer includes a dopant material, and a weight ratio of the nitroxy radical compound to the dopant material is from 0.001 to 0.3.

In a display device according to an eighth aspect of the disclosure, the bank is configured using a polyimide resin; and a photo-radical polymerization initiator is included in a polyamic acid, which is a precursor of the polyimide resin.

In a display device according to a ninth aspect of the disclosure, the red light-emitting layer includes the compound 4 of FIG. 9 as a host material.

In a display device according to a tenth aspect of the disclosure, the green light-emitting layer includes, as a host material, at least one of the compounds 4 and 5 illustrated in FIG. 9.

In a display device according to an eleventh aspect of the disclosure, the blue light-emitting layer includes, as a host material, the compound 6 of FIG. 9.

Additional Items

The disclosure is not limited to the embodiments described above, and embodiments obtained by appropriately combining technical approaches disclosed in the different embodiments also fall within the technical scope of the disclosure. Furthermore, novel technical features can be formed by combining the technical approaches disclosed in each of the embodiments.

Furthermore, the disclosure is not limited to a display panel, and can be widely applied to various devices formed on a resin layer. Examples thereof include a touch panel and sensors for X-rays and the like.

The invention claimed is:

1. A display device comprising:
    a display area comprising a light-emitting element layer including a plurality of light-emitting elements, a thin film transistor (TFT) layer provided below the light-emitting element layer and driving the plurality of light-emitting elements, and a sealing layer covering the light-emitting element layer; and
    a frame area surrounding the display area,
    wherein the light-emitting element layer is provided, such that each color of red, green, and blue has a corresponding light-emitting layer,
    the light-emitting layers of the colors red, green, and blue are partitioned by a bank comprising a resin material, and
    each light-emitting layer has;
        a center portion that is an introduction area containing at least one radical scavenger, among a hydrazide compound, a nitroxy radical compound, or a quinone or anthraquinone-based compound, in a plan view, and
        a non-introduction area into which the radical scavenger is not introduced in the plan view.

2. The display device according to claim 1, wherein the bank includes a photo-radical polymerization initiator.

3. The display device according to claim 1, wherein the hydrazide compound is a compound represented by the following structural formula.

[Chemical Formula 1]

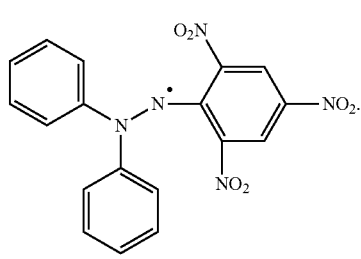

4. The display device according to claim 1,
wherein the hydrazide compound is a compound represented by the following structural formula.

[Chemical Formula 2]

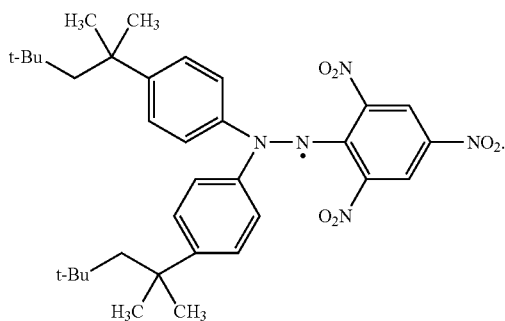

5. The display device according to claim 1,
wherein the nitroxy radical compound is a compound represented by the following structural formula.

[Chemical Formula 3]

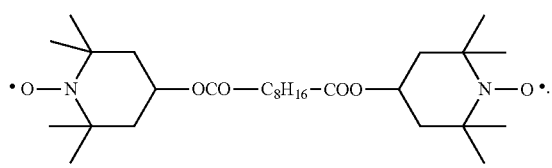

6. The display device according to claim 1,
wherein each light-emitting layer further includes a dopant material, and
a weight ratio of the hydrazide compound to the dopant material is from 0.0003 to 0.3.
7. The display device according to claim 1,
wherein each light-emitting layer further includes a dopant material, and
a weight ratio of the nitroxy radical compound to the dopant material is from 0.001 to 0.3.
8. The display device according to claim 1,
wherein the bank is configured using a polyimide resin, and
a photo-radical polymerization initiator is included in a polyamic acid, which is a precursor of the polyimide resin.
9. The display device according to claim 1,
Wherein the light-emitting layer corresponding to the color red includes, as a host material, a compound represented by the following structural formula.

[Chemical Formula 4]

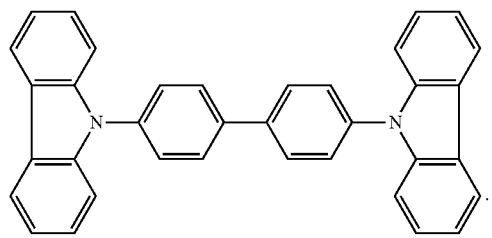

10. The display device according to claim 1,
wherein the light-emitting layer corresponding to the color green includes, as a host material, at least one compound represented by the following structural formulas.

[Chemical Formula 4]

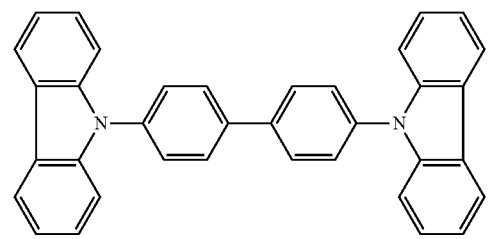

[Chemical Formula 5]

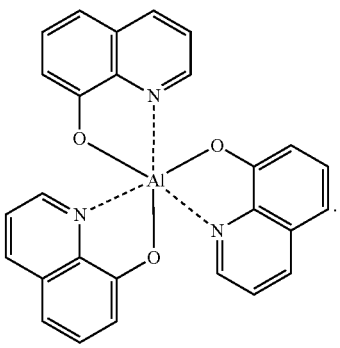

11. The display device according to claim 1,
wherein the light-emitting layer corresponding to the color blue includes, as a host material, a compound represented by the following structural formula.

[Chemical Formula 6]

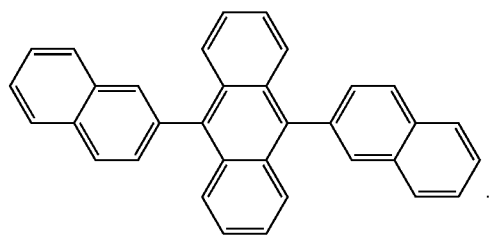

* * * * *